(12) United States Patent
Lee

(10) Patent No.: US 7,301,218 B2
(45) Date of Patent: Nov. 27, 2007

(54) PARALLEL CAPACITOR OF SEMICONDUCTOR DEVICE

(75) Inventor: Seong Woo Lee, Chungcheongbuk-do (KR)

(73) Assignee: Magnachip Semiconductor, Ltd., Chungcheongbuk-do (KR)

( * ) Notice: Subject to any disclaimer, the term of this patent is extended or adjusted under 35 U.S.C. 154(b) by 27 days.

(21) Appl. No.: 11/159,733

(22) Filed: Jun. 23, 2005

(65) Prior Publication Data

US 2005/0285226 A1   Dec. 29, 2005

(30) Foreign Application Priority Data

Jun. 25, 2004   (KR) ............... 10-2004-0048237

(51) Int. Cl.
*H01L 29/00* (2006.01)
(52) U.S. Cl. ............... 257/535; 257/27.048; 361/306.1

(58) Field of Classification Search ........ 257/E21.008, 257/E27.048, 532, 535; 361/303, 306.1
See application file for complete search history.

(56) References Cited

U.S. PATENT DOCUMENTS

| | | | | |
|---|---|---|---|---|
| 5,583,359 | A * | 12/1996 | Ng et al. | 257/306 |
| 2004/0126981 | A1* | 7/2004 | Rao et al. | 438/396 |
| 2005/0121744 | A1* | 6/2005 | Chang et al. | 257/532 |

* cited by examiner

*Primary Examiner*—Thomas L. Dickey
(74) *Attorney, Agent, or Firm*—Marshall, Gerstein & Borun LLP

(57) ABSTRACT

Disclosed herein is a parallel capacitor of a semiconductor device. According to the present invention, a first capacitor and a second capacitor are formed in different layers of the same region, wherein a metal layer connected to an upper electrode of the first capacitor is formed in the same layer as a metal layer connected to a lower electrode of the second capacitor. Thus, twp capacitors can be connected in parallel only with a metal layer composed of three layers. Accordingly, the present invention is advantageous in that it can reduce process steps for forming multiple metal layers, lower a step and cut manufacture cost.

11 Claims, 3 Drawing Sheets

PARALLEL CAPACITOR OF SEMICONDUCTOR DEVICE

BACKGROUND

1. Field of the Invention

The present invention relates to a parallel capacitor of a semiconductor device, and more specifically, to a parallel capacitor of a semiconductor device in which two capacitors are connected in parallel to enhance capacitance of the capacitors.

2. Discussion of Related Art

As the level of integration in semiconductor devices increases, researches have been actively made into fabrication of a capacitor having high capacitance in a narrow area. As one of methods, there has been made an attempt on a method in which capacitors are formed in different layers in the same region and are then connected in parallel to increase capacitance.

FIG. 1 is a cross-sectional view showing the structure of a conventional parallel capacitor.

Referring to FIG. 1, the conventional parallel capacitor includes a first capacitor C1, which is formed between a first metal layer 102 and a second metal layer 109a formed on the first metal layer 102, and a second capacitor C2, which is formed between a third metal layer 113b and a fourth metal layer 120a formed on the third metal layer 113b. Each of the first to fourth metal layers 102, 109a, 113b and 120a is formed in a different layer.

In the above, a lower electrode 103 of the first capacitor C1 is electrically connected to the first metal layer 102, and an upper electrode 105 is electrically connected to a second metal layer 109a by means of a via plug 107a. Furthermore, a lower electrode 114 of the second capacitor C2 is electrically connected to the third metal layer 113b, and an upper electrode 116 is electrically connected to a fourth metal layer 120a by means of a via plug 118b.

Meanwhile, the first and third metal layers 102 and 113, which are respectively connected to the lower electrodes 103 and 114 of the first and second capacitors C1 and C2 are electrically connected to second and fourth metal layers 109b and 120b by means of via plugs 107b, 111b and 118c. Furthermore, second and fourth metal layers 109a and 120a connected to the upper electrodes 105 and 116 of the first and second capacitors C1 and C2 are electrically connected to a third metal layer 113a by means of via plug 111a and 118a.

An unexplained reference numeral 101 indicates a semiconductor substrate, 104 and 115 indicate dielectric films, and 106, 108, 110, 112, 117 and 119 indicate interlayer insulating films.

Through the above structure, the first capacitor C1 and the second capacitor C2 are formed to have a parallel structure while being formed in different layers of the same region.

In the above structure, in order to fabricate the two capacitors C1 and C2 in a parallel structure, at least four metal layers 102, 109a, 113b and 120a are required. Such a large number of the metal layers requires a large number of process steps, and also cause a high step to occur. Moreover, if the level of integration in a device becomes high and a design rule thus becomes small, there is a limit to formation of a multi-metal wiring. Furthermore, reliability of a process is degraded and the cost is also increased.

SUMMARY OF THE INVENTION

Accordingly, the present invention has been made in view of the above problems, and it is an object of the present invention to provide a parallel capacitor of a semiconductor device in which a first capacitor and a second capacitor are formed in different layers of the same region, wherein a metal layer connected to an upper electrode of the first capacitor is formed in the same layer as that of a metal layer connected to a lower electrode of the second capacitor, so that two capacitors can be connected in parallel with only metal layers composed of three layers, whereby a process step for forming a multi-metal layer, a step and the cost can be reduced.

In order to accomplish the above object, according to an embodiment of the present invention, there is provided a parallel capacitor of a semiconductor device, comprising: a first metal layer in which a first layer is formed, the first metal layer being formed on a semiconductor substrate in which given structures are formed, a first capacitor formed in a second layer and having a lower electrode electrically connected to the first metal, a second metal layer formed in a third layer and electrically connected to the first metal layer, a third metal layer formed in the third layer and electrically connected to an upper electrode of the first capacitor, a second capacitor formed in a fourth layer and having a lower electrode electrically connected to the second metal layer, a fourth metal layer formed in a fifth layer and electrically connected to the second metal layer, a fifth metal layer formed in the fifth layer and electrically connected to an upper electrode of the second capacitor and the third metal layer, and a plurality of interlayer insulating films respectively formed between the first to fifth layer.

In the above, the first metal layer, the second metal layer and the fourth metal layer are formed in different layers of the same region, respectively. The third metal layer and the fifth metal layer are formed in different layers of the same region.

Furthermore, the first and second capacitors are formed in different layers of the same region. In this time, one side of the first capacitor is overlapped with the first metal layer, and the other side of the first capacitor is overlapped with the third metal layer. One side of the second capacitor is overlapped with the second metal layer, and the other side of the second capacitor is overlapped with the fifth metal layer.

DETAILED DESCRIPTION OF PREFERRED EMBODIMENTS

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

FIGS. 2a to 2e are cross-sectional views showing process steps for embodying a method of manufacturing a parallel capacitor in a semiconductor device according to an embodiment of the present invention.

Figure 1:
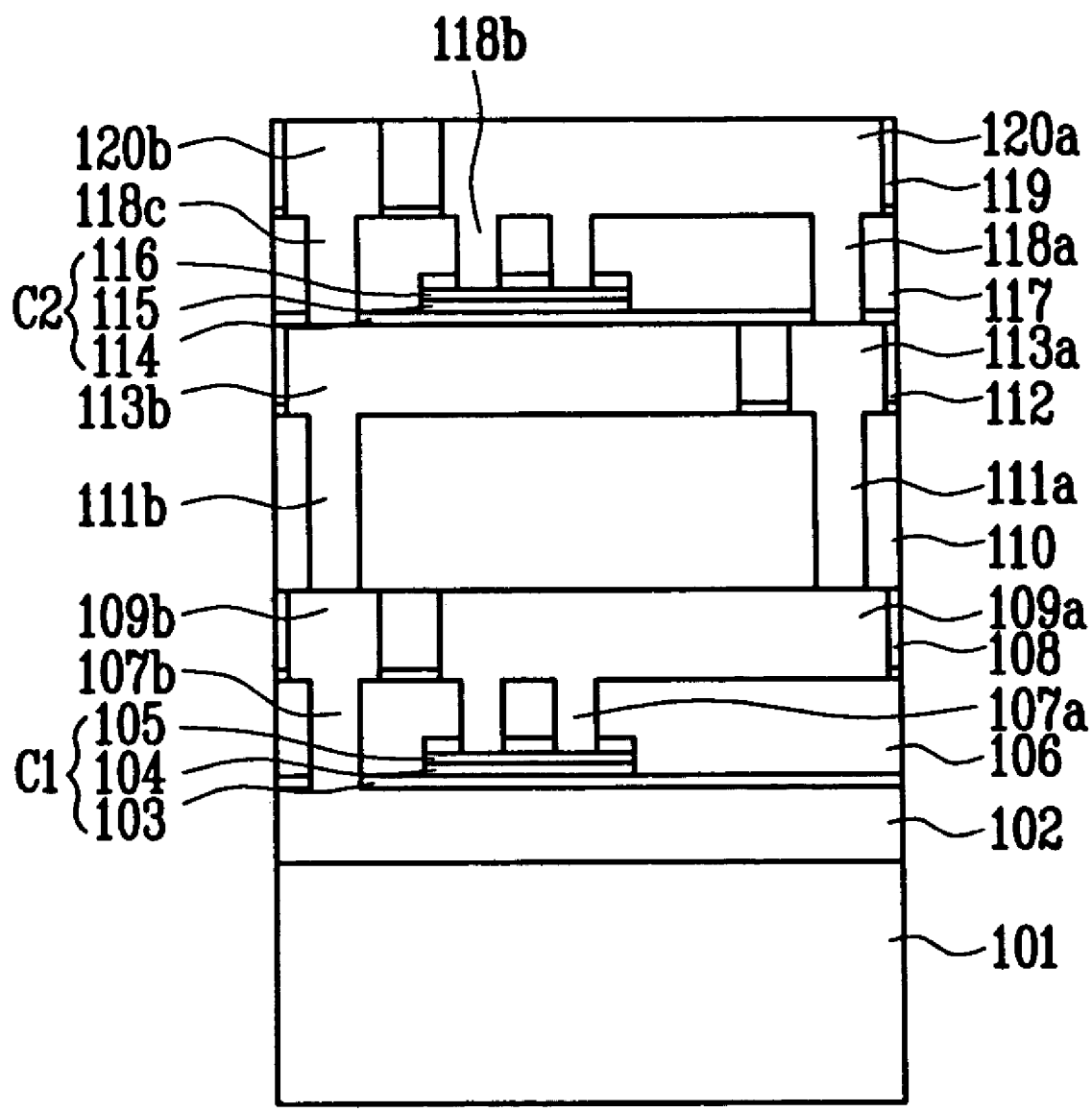
FIG. 1 is a cross-sectional view showing the structure of a conventional parallel capacitor.
Figure 2A:
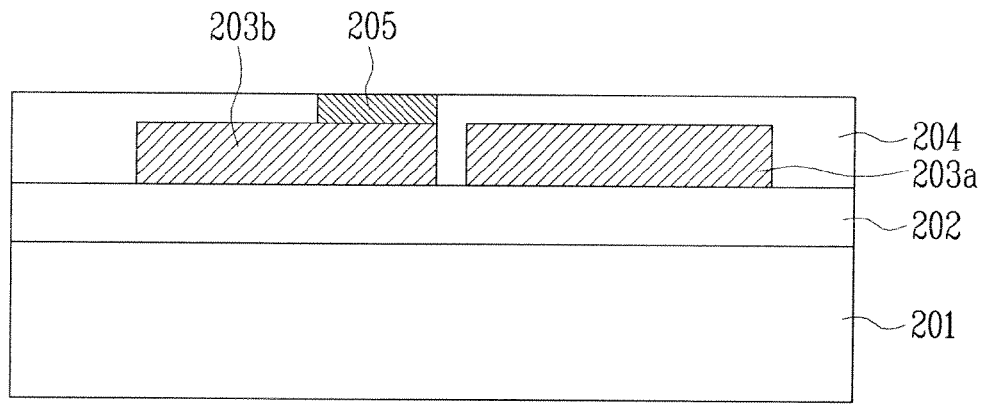
FIGS. 2a to 2e are cross-sectional views showing process steps for embodying a method of manufacturing a parallel capacitor in a semiconductor device according to an embodiment of the present invention.

Referring to FIG. 2a, a first interlayer insulating film 202 is formed on a semiconductor substrate 201 in which various elements (not shown) such as transistors are formed through common processes.

Thereafter, first metal layers 203a and 203b of a give pattern are formed on the first interlayer insulating film 202. A second interlayer insulating film 204 is then formed on the entire surface including the first metal layers 203a and 203b. In this time, the first metal layers 203a and 203b can be formed using aluminum.

Next, after a via hole is formed on the first metal layer 203b, a first via plug 205 is formed in the via hole.

Figure 2B:
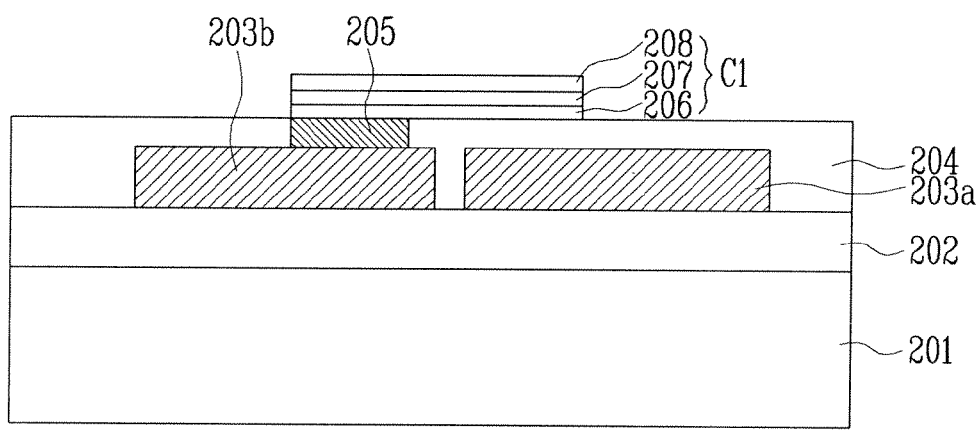

Referring to FIG. 2b, a first capacitor C1 in which a lower electrode 206, a dielectric film 207 and an upper electrode 208 are sequentially stacked is formed on a predetermined region over the second interlayer insulating film 204 including the first via plug 205. In this time, the lower electrode 206 and the upper electrode 208 can be formed using TiN or TaN. The lower electrode 206 can be formed using TaN and the upper electrode 208 can be formed using TiN, or the lower electrode 206 can be formed using TiN and the upper electrode 208 can be formed using TaN. Furthermore, the dielectric film 207 can be formed using Ta2O5.

Meanwhile, the via plug has to be formed in the first metal layer 203b by means of a subsequent process. It is thus preferred that the region where the first capacitor C1 and the first metal layer 203b are overlapped is controlled so that the first capacitor C1 is not formed in the region where the via plug will be formed. For example, the first capacitor C1 can be formed so that it is overlapped with the first metal layer 203b by half.

Figure 2C:
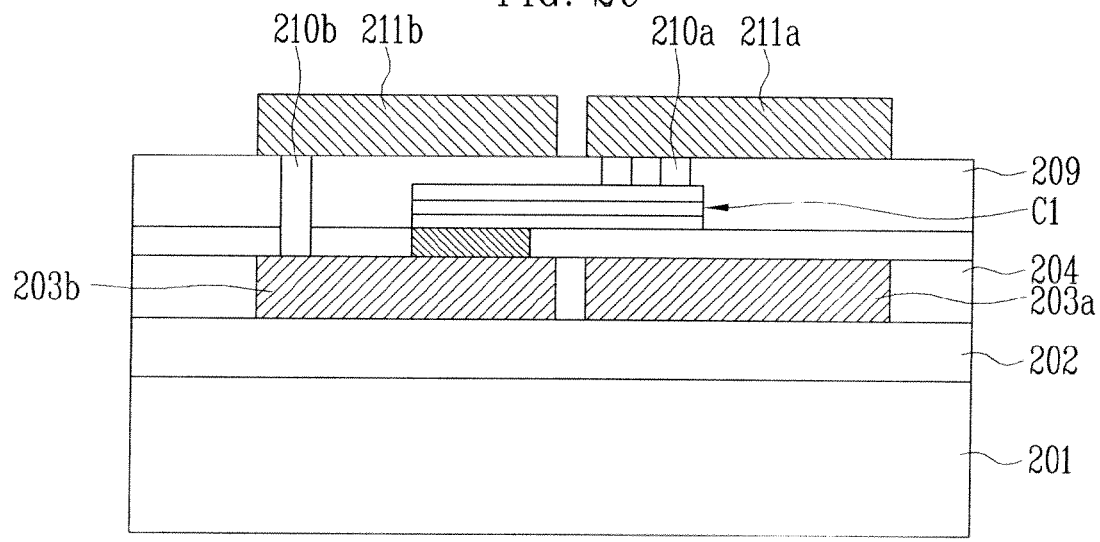

Referring to FIG. 2c, a third interlayer insulating film 209 is formed on the entire surface including the first capacitor C1. Thereafter, via holes are formed on the first capacitor C1 of the region where the first capacitor C1 and the first metal layer 203b are not overlapped and on the first metal layer 203b. The second via plugs 210a and 210b are then formed in the via holes, respectively.

Thereafter, a second metal layer 211a connected to the second via plug 210a and a second metal layer 211b connected to the second via plug 210b are formed on the third interlayer insulating film 209 including the second via plugs 210a and 210b. In this time, the second metal layers 211a and 211b can be formed using aluminum. Thereby, the second metal layer 211a is electrically connected to the upper electrode of the first capacitor C1, and the second metal layer 211b is electrically connected to the first metal layer 203b.

Meanwhile, the second metal layer 211a is formed in the same region as the region where the first metal layer 203a is formed, and the second metal layer 211b is formed in the same region as the region where the first metal layer 203b is formed, so that an occupied area is minimized. In this case, one side of the first capacitor C1 is overlapped with the first metal layer 203b, and the other side of the first capacitor C1 is overlapped with the second metal layer 211a.

Figure 2D:
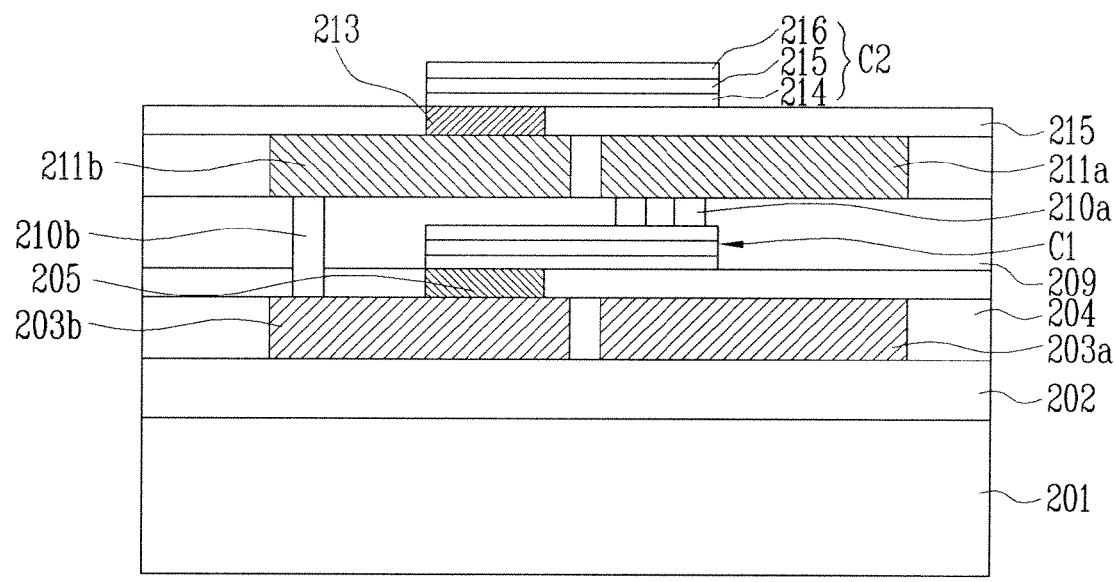

Referring to FIG. 2d, a fourth interlayer insulating film 212 is formed on the entire surface including the second metal layers 211a and 211b, and is then polished by means of a CMP process. Then, after a via hole is formed on the second metal layer 211b, a third via plug 213 is formed in the via hole. In this time, the third via plug 213 is preferably formed in the same region as the region where the first via plug 205 is formed.

Thereafter, a second capacitor C2 in which a lower electrode 214, a dielectric film 215 and an upper electrode 216 are stacked is formed on a predetermined region of the fourth interlayer insulating film 212 including the third via plug 213. In this time, the lower electrode 214 and the upper electrode 216 can be formed using TiN or TaN. The lower electrode 214 can be formed using TaN and the upper electrode 216 can be formed using TiN, or the lower electrode 214 can be formed using TiN and the upper electrode 216 can be formed using TaN. Furthermore, the dielectric film 215 can be formed using $Ta_2O_5$.

Meanwhile, it is required that a via plug be formed on the second metal layer 211b in a subsequent process. Therefore, in the same manner as the first capacitor C1, in the second capacitor C2, it is preferred that the region where the second capacitor C2 and the second metal layer 211b are overlapped is controlled so that the second capacitor C2 is not formed in a region where a via plug will be formed. For example, the second capacitor C2 can be formed so that it is overlapped with the second metal layer 211b by half. In this case, the second capacitor C2 is formed in the same region as the first capacitor C1.

Figure 2E:
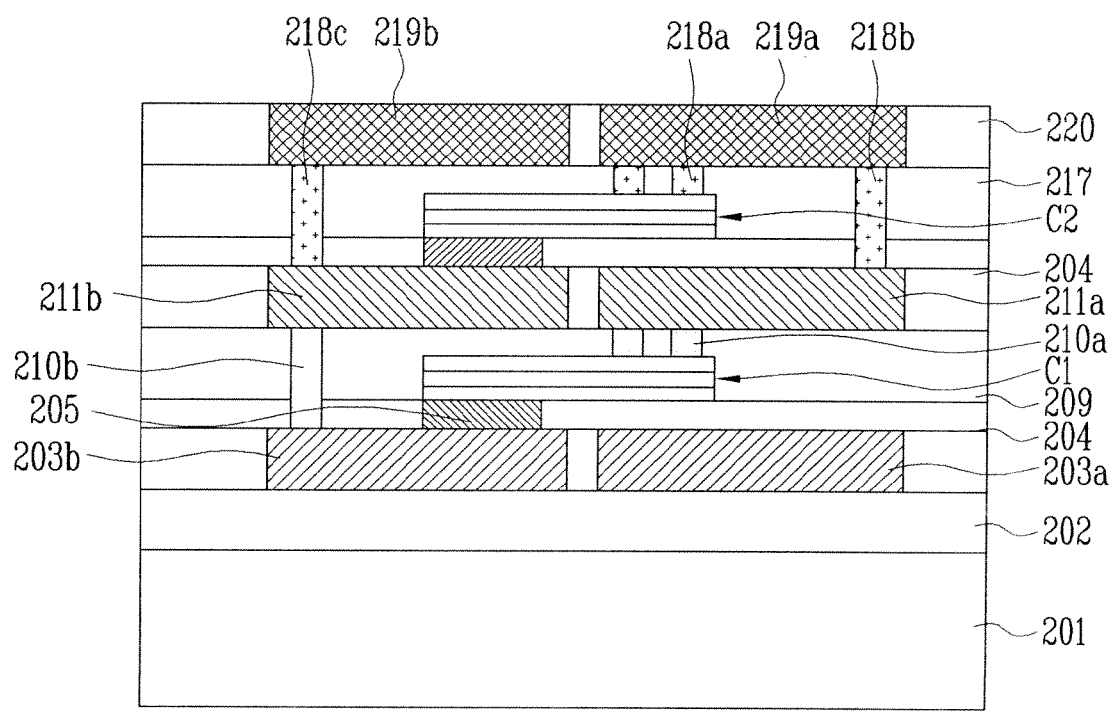

Referring to FIG. 2e, a fifth interlayer insulating film 217 is formed on the entire surface including the second capacitor C2. Via holes are then formed on the second capacitor C2 where it is not overlapped with the second metal layer 211b and on the second metal layers 211a and 211b. Then, fourth via plugs 218a to 218c are formed in the via holes, respectively.

Thereafter, a third metal layer 219a connected to the fourth via plugs 218a and 218b and a third metal layer 219b connected to the fourth via plug 218c are formed on the fifth interlayer insulating film 217 including the fourth via plugs 218a to 218c. In this time, the third metal layers 219a and 219b can be formed using aluminum. Thereby, the third metal layer 219a is electrically connected to the upper electrode of the first and second capacitors C1 and C2, and the third metal layer 219b is electrically connected to the lower electrode of the first and second capacitors C1 and C2.

Meanwhile, the third metal layer 219a is formed in the same region as the region where the first metal layer 203a is formed, and the third metal layer 219b is formed in the same region as the region where the first metal layer 203b is formed, so that areas occupied by them can be minimized. In this case, one side of the second capacitor C2 is overlapped with the third metal layer 219a, and the other side of the second capacitor C2 is overlapped with the third metal layer 219b.

Thereby, the structure in which two capacitor are connected in parallel can be formed only with a metal layer composed of three layers.

As described above, according to the present invention, a first capacitor and a second capacitor are formed in different layers of the same region, wherein a metal layer connected to an upper electrode of the first capacitor is formed in the same layer as a metal layer connected to a lower electrode of the second capacitor. Thus, two capacitors can be connected in parallel only with a metal layer composed of three layers. Accordingly, the present invention is advantageous in that it can reduce process steps for forming multiple metal layers, lower a step and cut manufacture cost.

What is claimed is:

1. A parallel capacitor of a semiconductor device, comprising:

a first layer having a first metal layer and a second metal layer formed over a semiconductor substrate in which given structures are formed, the first metal layer being isolated horizontally from the second metal layer;

a first capacitor having a first lower electrode, a first dielectric layer and a first upper electrode, in which the first capacitor is surrounded by a first insulating film formed over the first layer, the first lower electrode being electrically coupled to the first metal layer through a first via plug;

a second layer having a third metal layer and a fourth metal layer formed over the first insulating film, the third metal layer being isolated horizontally from the fourth metal layer and being electrically coupled to the first metal layer through a second via plug, in which the fourth metal layer is coupled to the first upper electrode through a third via plug;

a second capacitor having a second lower electrode, a second dielectric layer and a second upper electrode, in which the second capacitor is surrounded by a second insulating film formed over the second layer, the second lower electrode electrically coupled to the third metal layer through a fourth via plug; and a third layer having a fifth metal layer and a sixth metal layer formed over the second insulating film, the fifth metal layer being isolated horizontally from the sixth metal layer and being electrically coupled to the third metal layer through a fifth via plug, in which the sixth metal layer is coupled to the second upper electrode through a sixth via plug and is coupled to the fourth metal layer through a seventh via plug, wherein one side of the first capacitor is overlapped with the first metal layer, and another side of the first capacitor is overlapped with the second metal layer.

2. The parallel capacitor as claimed in claim 1, wherein the first layer, the second layer and the third layer are formed in different layers of the same region, respectively.

3. The parallel capacitor as claimed in claim 1, wherein the first and second capacitors are formed in different layers of the same region.

4. The parallel capacitor as claimed in claim 1, wherein one side of the second capacitor is overlapped with the third metal layer, and the other side of the second capacitor is overlapped with the fourth metal layer.

5. The parallel capacitors as claimed in claim 1, wherein the third metal layer is formed in the same region as the region where the first metal layer is formed, and the fourth metal layer is formed in the same region as the region where the second metal layer is formed.

6. The parallel capacitors as claimed in claim 1, wherein the fifth metal layer is formed in the same region as the region where the first metal layer is formed, and the sixth metal layer is formed in the same region as the region where the second metal layer is formed.

7. A parallel capacitor of a semiconductor device, comprising:

a first layer having a first metal layer and a second metal layer formed over a semiconductor substrate in which given structures are formed, the first metal layer being isolated horizontally from the second metal layer;

a first capacitor having a first lower electrode, a first dielectric layer and a first upper electrode, in which the first capacitor is surrounded by a first insulating film formed over the first layer, the first lower electrode being electrically coupled to the first metal layer through a first via plug;

a second layer having a third metal layer and a fourth metal layer formed over the first insulating film, the third metal layer being isolated horizontally from the fourth metal layer and being electrically coupled to the first metal layer through a second via plug, in which the fourth metal layer is coupled to the first upper electrode through a third via plug;

a second capacitor having a second lower electrode, a second dielectric layer and a second upper electrode, in which the second capacitor is surrounded by a second insulating film formed over the second layer, the second lower electrode electrically coupled to the third metal layer through a fourth via plug; and a third layer having a fifth metal layer and a sixth metal layer formed over the second insulating film, the fifth metal layer being isolated horizontally from the sixth metal layer and being electrically coupled to the third metal layer through a fifth via plug, in which the sixth metal layer is coupled to the second upper electrode through a sixth via plug and is coupled to the fourth metal layer through a seventh via plug, wherein one side of the second capacitor is overlapped with the third metal layer, and another side of the second capacitor is overlapped with the fourth metal layer.

8. The parallel capacitor as claimed in claim 7, wherein the first layer, the second layer and the third layer are formed in different layers of the same region, respectively.

9. The parallel capacitor as claimed in claim 7, wherein the first and second capacitors are formed in different layers of the same region.

10. The parallel capacitors as claimed in claim 7, wherein the third metal layer is formed in the same region as the region where the first metal layer is formed, and the fourth metal layer is formed in the same region as the region where the second metal layer is formed.

11. The parallel capacitors as claimed in claim 7, wherein the fifth metal layer is formed in the same region as the region where the first metal layer is formed, and the sixth metal layer is formed in the same region as the region where the second metal layer is formed.

* * * * *

UNITED STATES PATENT AND TRADEMARK OFFICE
CERTIFICATE OF CORRECTION

PATENT NO. : 7,301,218 B2 Page 1 of 1
APPLICATION NO. : 11/159733
DATED : November 27, 2007
INVENTOR(S) : Seong W. Lee It is certified that error appears in the above-identified patent and that said Letters Patent is hereby corrected as shown below:

On the Title Page:

Item (73) Assignee, "Magnachip" should be -- MagnaChip --.

Item (57) Abstract, line 7, "twp" should be -- two --.

Signed and Sealed this

Third Day of June, 2008

JON W. DUDAS
*Director of the United States Patent and Trademark Office*